United States Patent [19]
Mitani et al.

[11] Patent Number: 5,329,138
[45] Date of Patent: Jul. 12, 1994

[54] SHORT CHANNEL CMOS DEVICE CAPABLE OF HIGH PERFORMANCE AT LOW VOLTAGE

[75] Inventors: Shinichiroo Mitani, Tokorozawa; Kenichi Kikushima, Ohme; Fumio Ootsuka, Tokorozawa, all of Japan

[73] Assignee: Hitachi, Ltd., Tokyo, Japan

[21] Appl. No.: 921,248

[22] Filed: Jul. 29, 1992

[30] Foreign Application Priority Data

Jul. 29, 1991 [JP] Japan .................................. 3-188470

[51] Int. Cl.$^5$ .................. H01L 29/804; H01L 29/792; H01L 29/78
[52] U.S. Cl. ...................................... 257/42; 257/345; 257/403; 257/338; 257/296
[58] Field of Search ............... 257/345, 403, 338, 296, 257/162, 234, 347, 758, 42

[56] References Cited

U.S. PATENT DOCUMENTS

| | | | |
|---|---|---|---|
| 4,784,968 | 7/1987 | Kumori et al. | 257/345 |
| 5,166,765 | 8/1991 | Lee et al. | 257/345 |

OTHER PUBLICATIONS

A High Performance Sub-Half Micron CMOS Technology for Fast SRAMS, J. Hayden et al, 1989 IEEE.

*Primary Examiner*—William L. Sikes
*Assistant Examiner*—Fetsum Abraham
*Attorney, Agent, or Firm*—Antonelli, Terry, Stout & Kraus

[57] ABSTRACT

Herein disclosed is a CMOSFET, in which an n-channel MISFET Qn has a gate electrode 11n made of n-type polycrystalline silicon, in which a p-channel MISFET Qp has a gate electrode 11p made of p-type polycrystalline silicon, In which the n-channel MISFET Qn and the p-channel MISFET Qp have their respective channel regions formed with heavily doped impurity layers 12p and 12n having the conductivity types identical to those of their wells 3 and 2, and in which the individual heavily doped impurity layers 12p and 12n have their respective surfaces formed with counter-doped layers 13n and 13p having the opposite conductivity types.

8 Claims, 16 Drawing Sheets

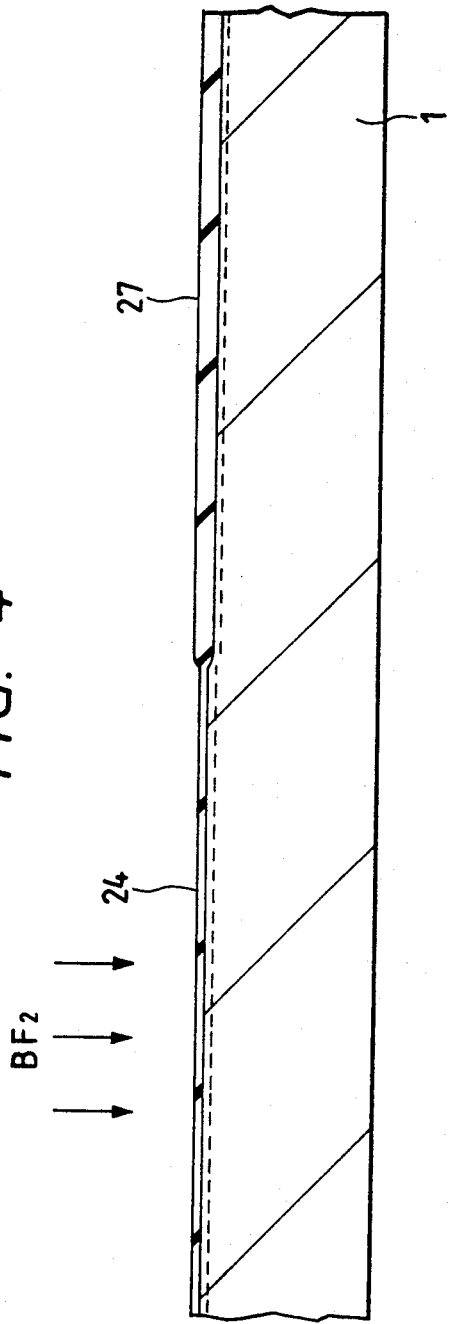
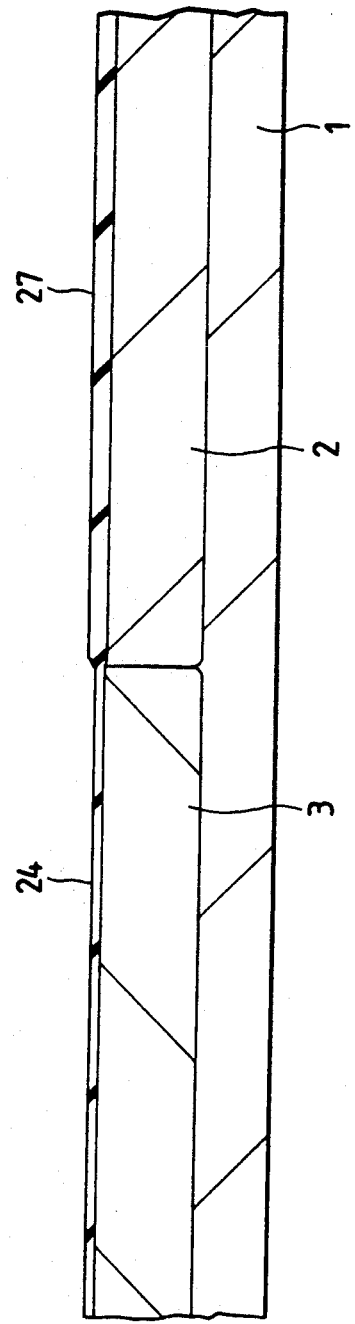

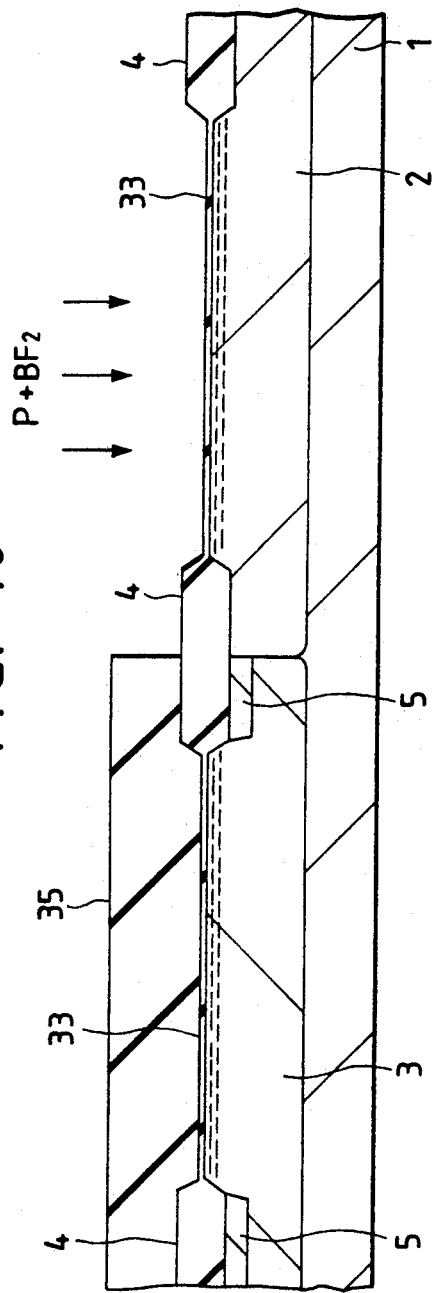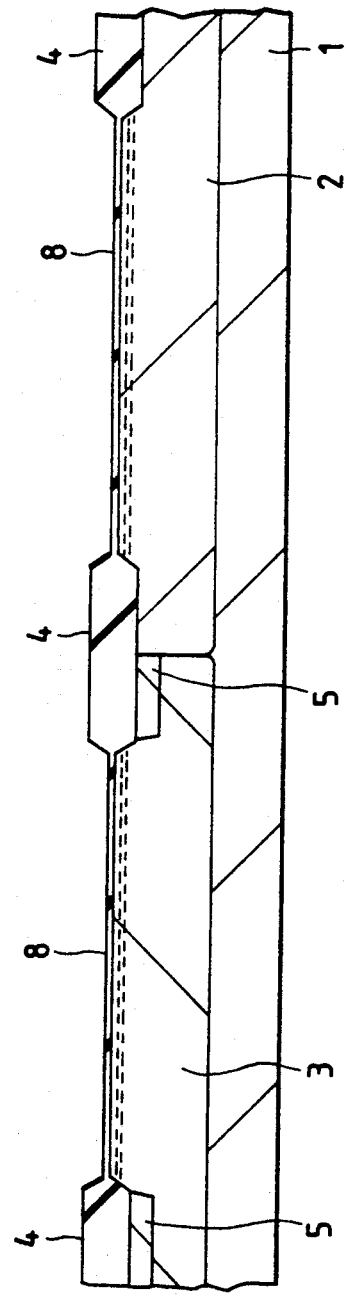

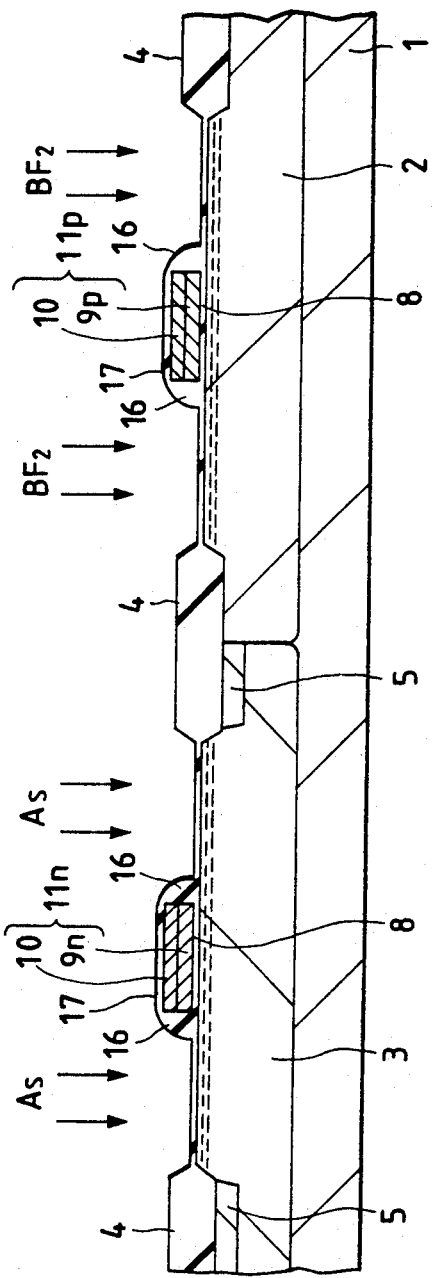
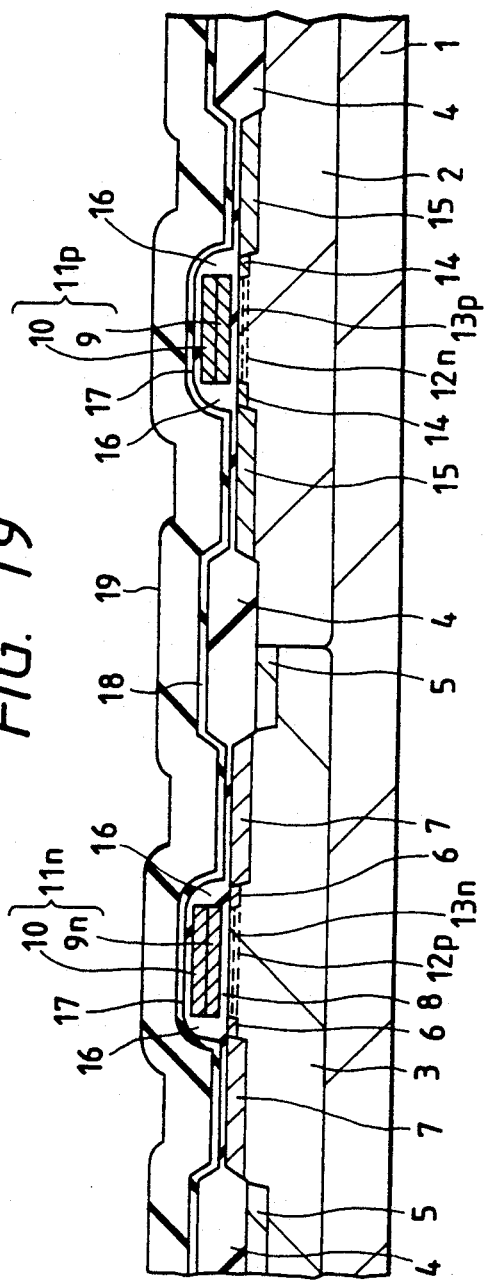

AMOUNT OF DOPING IMPURITY OF CONDUCTIVITY TYPE IDENTICAL TO THAT OF WELL ($\times 10^{12}/cm^2$)

DEPTH OF COUNTER-DOPED LAYER [μm]

SHORT CHANNEL CMOS DEVICE CAPABLE OF HIGH PERFORMANCE AT LOW VOLTAGE

BACKGROUND OF THE INVENTION

The present invention relates to semiconductor integrated circuit device and, more particularly, to a technology which is effective when applied to short channel CMOS device capable of exhibiting high performance when driven at a low voltage.

The CMOSFET (i.e., Complementary MISFET), in which an n-channel MISFET and a p-channel MISFET are formed over a common semiconductor substrate, is applied to almost all devices including microcomputers, gate arrays and memories partly because their power consumption can be reduced and partly because they can be miniaturized to operate at high speed.

A CMOS arrangement is disclosed on pp. 417 to 420 of "A HIGH-PERFORMANCE SUB-HALF MICRON CMOS TECHNOLOGY FOR FAST SRAMS" of IEDM 89, Technical Digest, for example. In this CMOS, the n-channel MISFET and the p-channel MISFET have their gate electrodes made of n-type and p-type polycrystalline silicon, respectively, and their channel regions doped with an impurity having a conductivity type identical to that of the well to adjust their threshold voltage [Vth]. Moreover, an impurity having a conductivity type identical to that of the wells is formed under the channel region so as to prevent the punch-through.

SUMMARY OF THE INVENTION

Recently, CMOS devices have been miniaturized to operate at a constant supply voltage [Vcc] of 5 V to realize a high degree of integration and performance.

In CMOS devices having at least a gate length of 0.3 $\mu$m or less, however, it is unavoidable that the supply voltage [Vcc] must be dropped to prevent a reduction in reliability due to hot carriers and the aging (i.e., TDDB) of gate oxide films, as well as for meeting a demand for low power consumption.

In case the supply voltage [Vcc] is to be dropped, high-performance cannot be obtained unless the threshold voltage [Vth] is also dropped according to the scaling rule. Unless the threshold voltage [Vth] is dropped, the carrier concentration drops, and the operation occurs only in a bias region (i.e., the region having a low carrier mobility) having a high gate electric field so that the current drivability drops.

The n-channel MISFET and p-channel MISFET of the prior art having a gate length of 0.5 $\mu$m and driven at a supply voltage of 5 V have threshold voltages [Vth] of about 0.8 V and $-0.8$ V, respectively.

Therefore, let it be assumed that a CMOSFET having a gate length of 0.2 $\mu$m, for example, is driven at a supply voltage of 2 V. Since the electric field of the channel is then identical to that of a CMOSFET having a gate length of 0.5 $\mu$m and a supply voltage of 5 V, no problem arises in the drop of the reliability due to the hot carriers. However, the threshold voltage [Vth] has to be dropped to 0.8 V$\times$0.4, i.e., about 0.3 V, so as to realize a higher performance (i.e., the delay time of the circuit of 0.4 times) corresponding to the scaling ratio (of 0.4 times) than that of the CMOSFET having a gate length of 0.5 $\mu$m and a supply voltage of 5 V.

In accordance with the scaling of the gate length, on the other hand, the gate oxide film also has to be thinned at substantially the same scaling ratio (of 0.4 times).

In case the gate length is shortened, the channel impurity concentration has to be set at a high value so as to prevent the punch-through between the source and the drain. Since, on the other hand, the surface potential at the threshold voltage [Vth] is substantially constant at $2\Phi_F$, the threshold voltage [Vth] cannot be sufficiently dropped. In other words, the punch-through cannot be prevented if the threshold voltage [Vth] is dropped.

Thus, the CMOS structure of the prior art has failed to improve the gate length dependency of the threshold voltage [Vth] according to the short channel, resulting in difficulty in realizing a short channel CMOSFET which can exhibit high performance if driven at low voltage.

An object of the present invention is to provide a technology which can realize a short channel CMOSFET capable of exhibiting a high performance if driven at a low voltage.

The aforementioned and other objects and novel features of the present invention will become apparent from the following description to be made with reference to the accompanying drawings.

Representative embodiments of the invention to be disclosed herein will be summarized in the following.

The CMOS structure of the present invention is made such that an enhancement n-channel MISFET has its gate electrode made of n-type polycrystalline silicon, such that an enhancement p-channel MISFET has its gate electrode made of p-type polycrystalline silicon, such that the n-channel MISFET and the p-channel MISFET have their individual channel regions formed with heavily doped impurity layers having conductivity types identical to those of their respective substrates, and such that the n-channel MISFET and the p-channel MISFET have their respective heavily doped impurity layers formed in their surfaces with counter-doped layers having the conductivity types opposite to those of the heavily doped impurity layers.

(1) Since the n-channel MISFET and the p-channel MISFET have their individual channel regions formed with the heavily doped impurity layers having the conductivity types identical to those of their respective substrates, the punch-through between the source and the drain due to the short channel can be prevented to improve the gate length dependency of the threshold voltage [Vth].

(2) Since the n-channel MISFET and the p-channel MISFET have their respective heavily doped impurity layers formed in their surfaces with counter-doped layers having the conductivity types opposite to those of the heavily doped impurity layers, the threshold voltage [Vth] can be dropped.

(3) Since the n-channel MISFET has an n-type gate electrode, while the p-channel MISFET has a p-type gate electrode, the threshold voltage [Vth] can be dropped even for a low impurity concentration of the counter-doped layer.

(4) Since the counter-doped layer can have a low impurity concentration, the pn junction to be formed in the channel region can be made shallow so that the counter-doped layer acts to change the difference in the work function between the gate electrode and the substrate.

(5) Thanks to the foregoing features (1) to (4), the threshold voltage [Vth] can be dropped without having its gate length dependency deteriorated.

BRIEF DESCRIPTION OF THE DRAWINGS

FIGS. 2 to 19 are sections of the essential portions of a semiconductor substrate and shows a process for manufacturing the CMOSFET;

DETAILED DESCRIPTION OF THE PREFERRED EMBODIMENT

Figure 1:
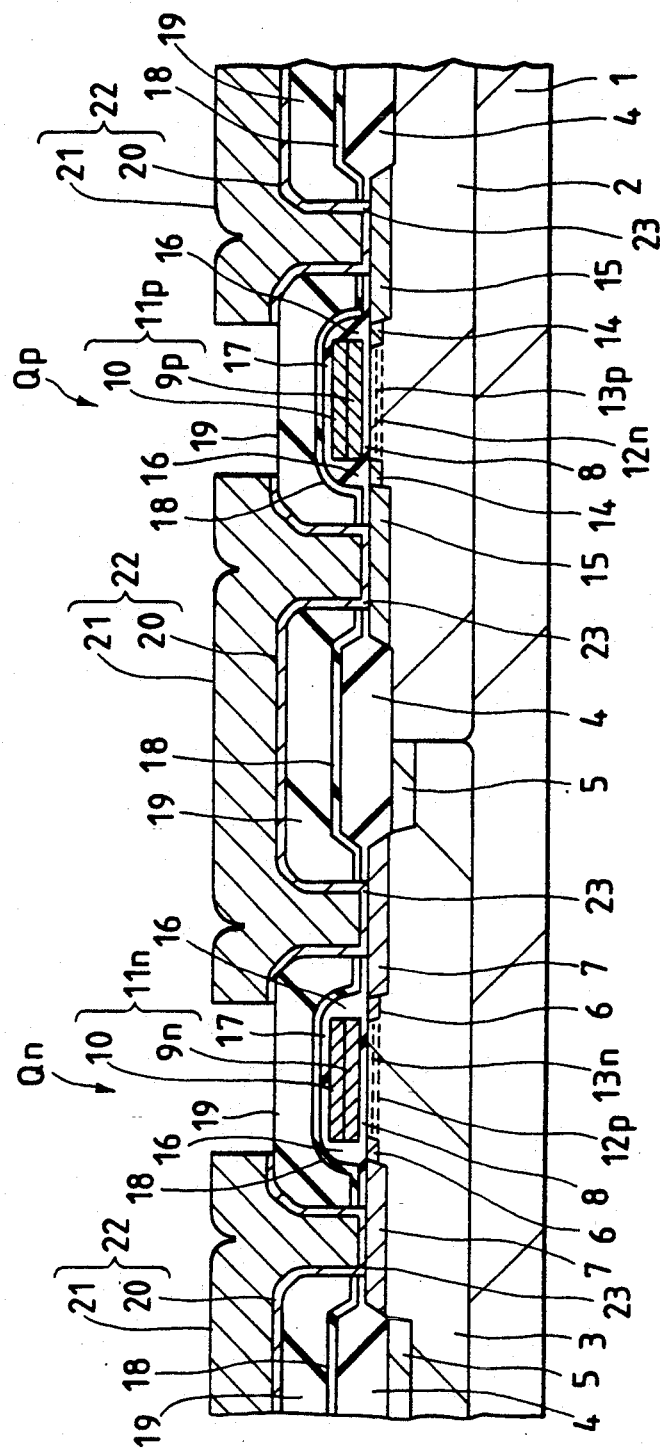
FIG. 1 is a section of an essential portion of a semiconductor substrate and shows a CMOSFET according to one embodiment of the present invention.

The present invention will be described in the following in connection with an embodiment thereof. Incidentally, parts having an identical function are designated with a common reference numeral throughout all the Figures for explaining the embodiment, and their repeated description will be omitted.

A CMOSFET for the logic LSI according to one embodiment of the present invention has a structure such as shown in FIG. 1.

A semiconductor substrate 1 made of $n^{31}$-type single crystal silicon is provided, and an n-type well 2 and a p-type well 3 are formed on the substrate.

The active region of the n-type well 2, which is enclosed by an element isolating field insulating film 4, is formed with an enhancement type p-channel MISFET Qp. Likewise, the active region of the p-type well 3 is formed with an n-channel MISFET Qn. The p-type well 3 is formed below its field insulating film 4 with a p-type channel stopper region 5.

The n-channel MISFET Qn is constructed to include: a source and a drain of the LDD (i.e., Lightly Doped Drain) structure composed of an $n^-$-type semiconductor region 6 and an $n^+$-type semiconductor region 7 formed in the surface of the p-type well 3; a gate insulating film 8 made of a silicon oxide film; and a gate electrode 11n of a polycide structure formed by laminating a silicide film 10 of $WSi_x$ or the like over an $n^+$-type polycrystalline silicon film 9n.

Moreover, the aforementioned n-channel MISFET Qn has its channel region formed with a p-type heavily doped impurity layer 12p, which in turn has its surface formed with an n-type counter-doped layer 13n. The p-type heavily doped impurity layer 12p and n-type counter-doped layer 13n constitute a pn junction.

On the other hand, the p-channel MISFET Qp is constructed to include: a source and a drain of the LDD structure composed of a $p^-$-type semiconductor region 14 and a $p^+$-type semiconductor region 15 formed in the surface of the n-type well 2; a gate insulating film 8 made of a silicon oxide film; and a gate electrode 11p of a polycide structure formed by laminating a silicide film 10 over a $p^+$-type polycrystalline silicon film 9p.

Moreover, the aforementioned p-channel MISFET Qp has its channel region formed with an n-type heavily doped impurity layer 12n, which in turn has its surface formed with a p-type counter-doped layer 13p. The n-type heavily doped impurity layer 12n and p-type counter-doped layer 13p constitute a pn junction.

Thus, the CMOSFET of the present embodiment is given the CMOS structure. Specifically, the n-channel MISFET Qn is the $n^+$-type gate electrode 11n and is formed its channel region with the p-type heavily doped impurity layer 12p and the n-type counter-doped layer 13n, and the p-channel MISFET Qp has the $p^+$-type gate electrode 11p and is formed in its channel region with the n-type heavily doped impurity layer 12n and the p-type counter-doped layer 13p.

The aforementioned n-channel MISFET Qn is given a gate length of 0.2 μm and a threshold voltage [Vth] of about 0.3 V, and the p-channel MISFET Qp is given a gate length of 0.2 μm and a threshold voltage [Vth] of about −0.3 V. Moreover, a supply voltage [Vcc] of the circuit for driving the n-channel MISFET Qn and the p-channel MISFET Qp is set at 2 V, and a reference voltage [Vss] is set to 0V.

The aforementioned n-channel MISFET Qn and p-channel MISFET Qp have their gate electrodes 11n and 11p formed at their side walls with side wall spacers 16 made of a silicon oxide film. Moreover, a silicon oxide film 17 is formed over the gate electrodes 11n and 11p.

The aforementioned side wall spacer 16 and silicon oxide film 17 are overlain by a silicon oxide film 18, which in turn is overlain by a BPSG (i.e., Boron Phosphor Silicate Glass) film 19.

This BPSG film 19 is formed thereover with a metal wiring line 22 which is formed by laminating an Al alloy film 21 over a barrier metal 20. The metal wiring line 22 is electrically connected through connection holes 23 with the sources and drains of the n-channel MISFET Qn and the p-channel MISFET Qp.

Next, one example of a process for manufacturing the CMOSFET having the aforementioned structure will be described with reference to FIGS. 2 to 19.

First of all, the semiconductor substrate 1 made of $n^-$-type single crystal silicon having a resistance of about 10 [Ω/cm] is thermally oxidized to form a silicon oxide film 24 having a thickness of about 20 nm in its surface [(100) plane]. After this, a silicon nitride film 25 having a thickness of about 50 nm is deposited over the silicon oxide film 24 by using a CVD method.

Figure 2:
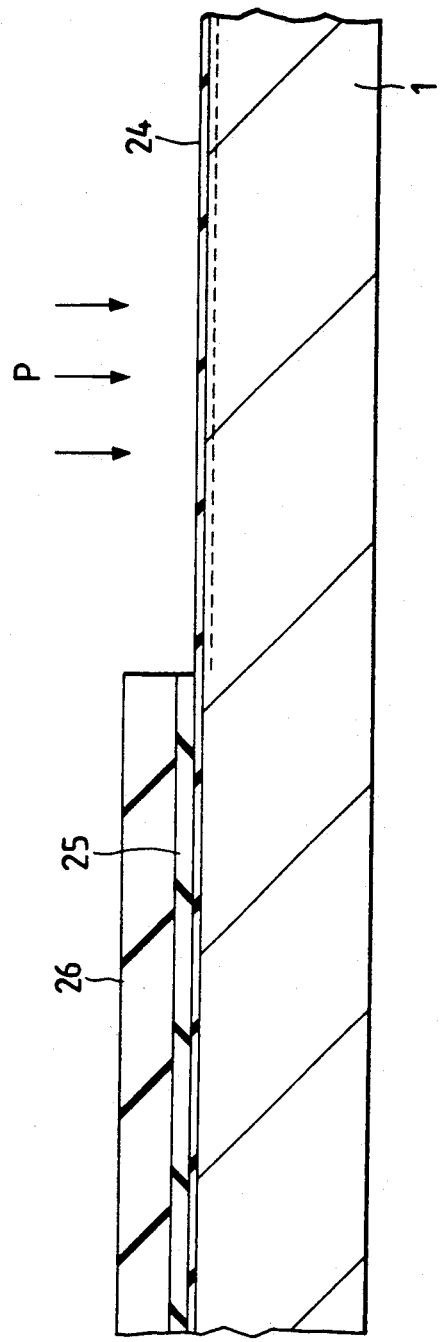

Subsequently, a photoresist film 26 is formed to have a p-channel MISFET forming region opened and is used as a mask to etch the silicon nitride film 25 off. After this, the substrate surface of the present invention MISFET forming region is implanted with phosphor (P) ions in a dose of $3.0 \times 10^{13}/cm^2$ by an energy of 125 KeV (as shown in FIG. 2).

Next, the photoresist Film 26 is removed by ashing, and the substrate surface is then thermally oxidized to form a silicon oxide film 27 having a thickness of 120 nm. Since the aforementioned silicon nitride film 25 acts as the mask for the oxidation, the silicon oxide film 27 is formed only in the substrate surface in the region doped with the phosphor ions.

Figure 3:
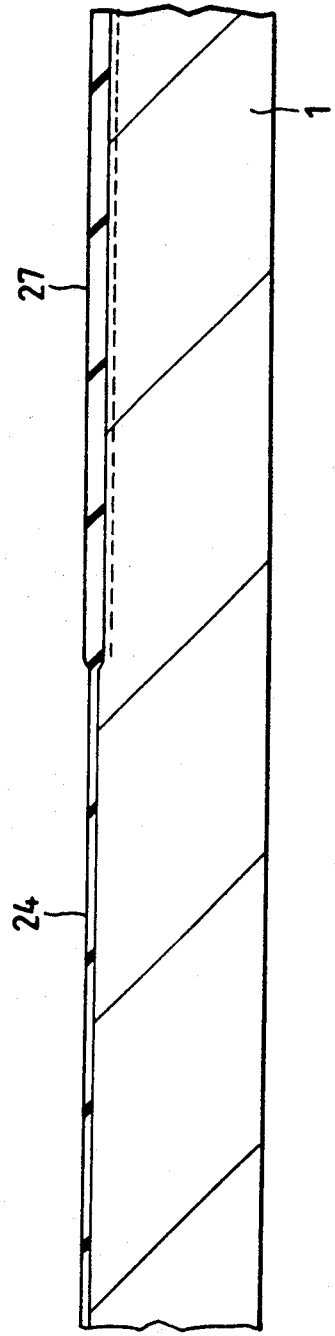

Subsequently, the silicon oxide film of a thickness of about 5 nm formed in the surface of the silicon nitride film 25 is etched off in a diluted aqueous solution of fluoric acid. After this, the silicon nitride film 25 is etched off with hot phosphoric acid (as shown in FIG. 3).

Next, an ion implantation of $BF_2$ ions is carried out in a dose of $3.0 \times 10^{13}/cm^2$ by an energy of 40 KeV. Since the aforementioned silicon oxide film 27 acts as a mask for the ion implantation, only the subtrate surface in the region left undoped with the phosphor is doped with the $BF_2$ ions (as shown in FIG. 4).

Next, a heat treatment of 180 minutes is carried out in the atmosphere of nitrogen at 1,200° C. to extend and diffuse the aforementioned phosphor ions and $BF_2$ ions thereby to form the n-type well 2 and the p-type well 3 (as shown in FIG. 5). Both of the n-type well 2 and the p-type well 3 have a depth of about 4 μm and a surface impurity concentration of about $5.0 \times 10^{17}/cm^3$.

Next, the silicon oxide films 24 and 27 in the substrate surface are etched off in a diluted aqueous solution of fluoric acid. After this, the substrate surface is thermally oxidized to form a silicon oxide film 28 having a thickness of about 10 nm, and a silicon nitride film 29 having a thickness of about 140 nm is deposited over the silicon oxide film 28 by using a CVD method.

Figure 6:
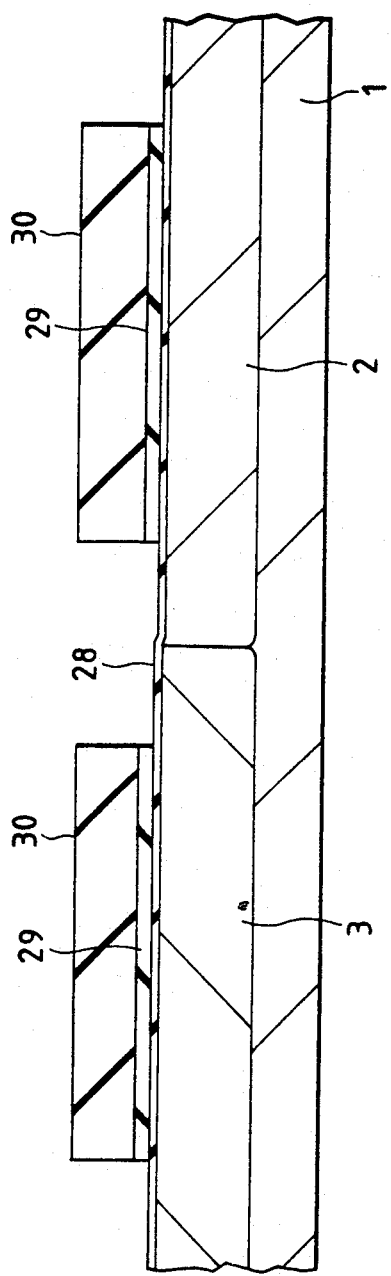

Subsequently, a photoresist film 30 having its element isolating region opened is formed and is used as a mask to etch off the silicon nitride film 29 (as shown in FIG. 6).

Figure 7:
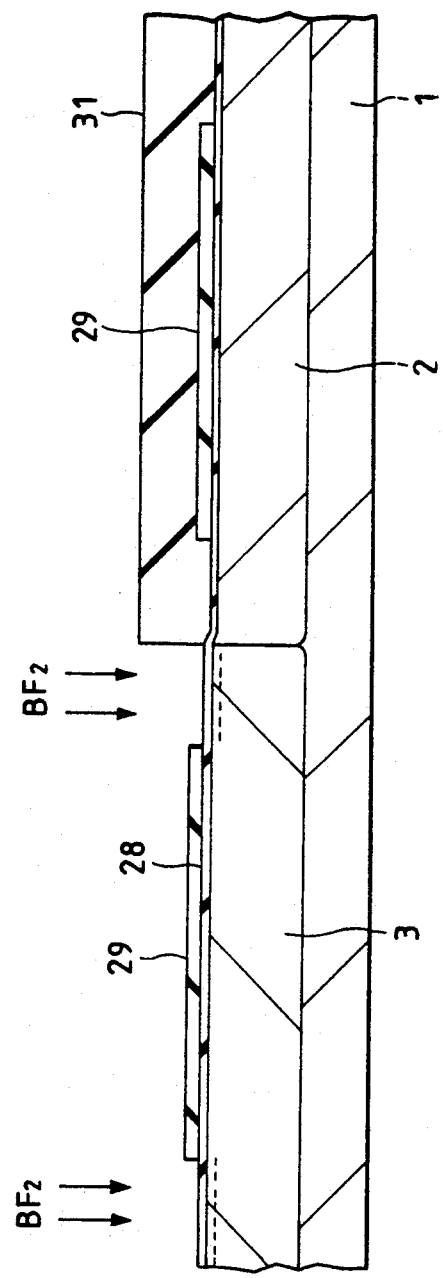

Next, the photoresist film 30 is removed by ashing. After this, a photoresist film 31 is formed while leaving the p-type well 3 opened, and an ion implanatation of $BF_2$ ions is carried out in a dose of $7.0 \times 10^{13}/cm^2$ by an energy of 40 KeV. Since the photoresist film 31 and the silicon nitride film 29 act as the masks for the ion implantation, only the element isolating region of the p-type well 3 is doped with the $BF_2$ ions (as shown in FIG. 7).

Next, the photoresist film 31 is removed by ashing. After this, a heat treatment of 30 minutes is carried out in the nitrogen atmosphere at 1,200° C., and the substrate surface is thermally oxidized in the steam atmosphere at 1,000° C. to form the field insulating film 4 made of a silicon oxide film having a thickness of about 300 nm. Simultaneously with this, the p-type channel stopper region 5 is formed below the field insulating film 4 of the p-type well 3.

Figure 8:
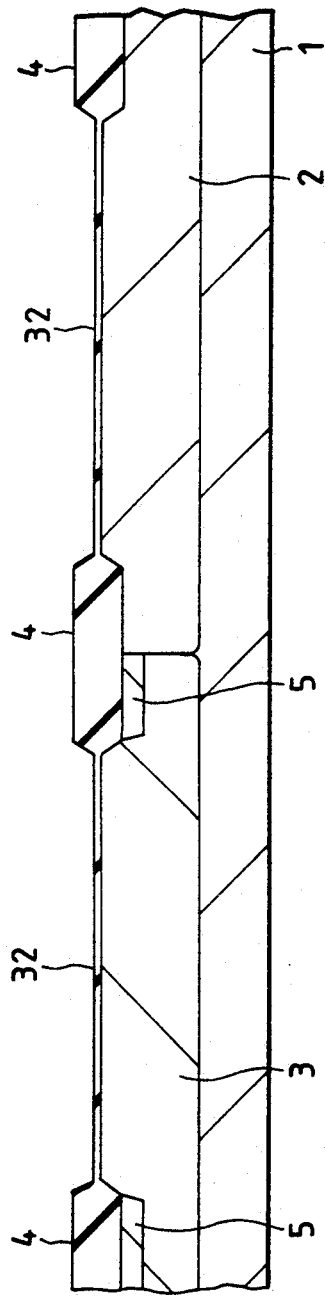

Subsequently, the silicon oxide film having a thickness of about 15 nm formed in the surface of the silicon nitride film 29 is etched off in a diluted aqueous solution of fluoric acid. After this, the silicon nitride film 29 is etched off with hot phosphoric acid, and the substrate surface is thermally oxidized in the steam atmosphere at 850° C. to form a silicon oxide film 32 having a thickness of about 20 nm in the active regions of the n-type well 2 and p-type well 3 (as shown in FIG. 8).

Next, the silicon oxide film 32 is etched off in a diluted aqueous solution of fluoric acid. After this, the substrate surface is thermally oxidized again in the steam atmosphere at 850° C. to form a silicon oxide film 33 having a thickness of about 10 nm in the active regions of the n-type well 2 and the p-type well 3.

This silicon oxide film 33 is used for a channel doping and has to have a highly accurate thickness for controlling the threshold voltage [Vth]. The thickness is desirably controlled to $10 \pm 0.5$ nm.

Figure 9:
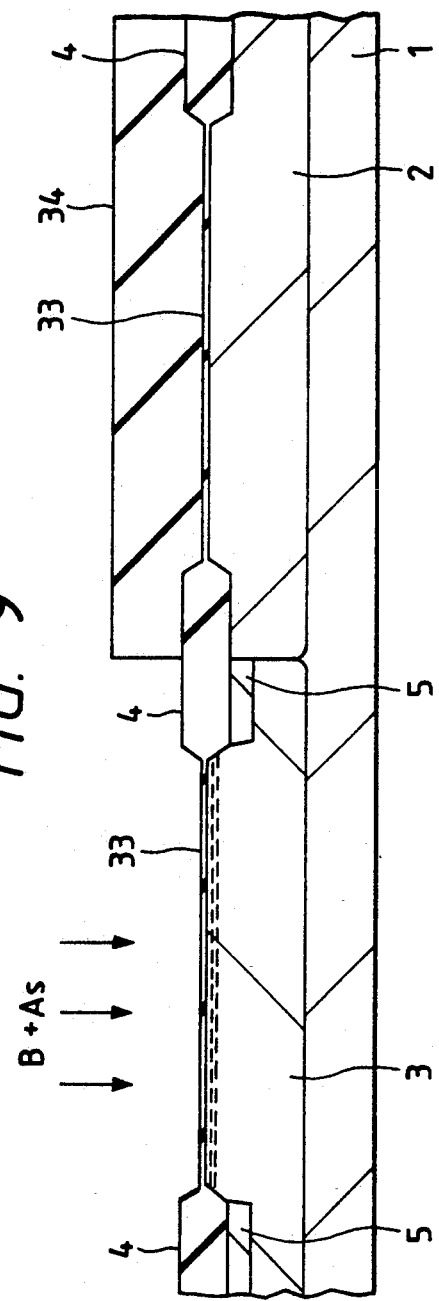

Subsequently, a photoresist film 34 having the n-channel MISFET forming region opened is formed to accomplish the channel doping for the n-channel MISFET (as shown in FIG. 9). At first, an ion implantation of boron (B) ions is carried out in a dose of $7.0 \times 10^{12}/cm^2$ by an energy of 20 KeV. After this, another ion implantation of arsenic (As) ions is carried out in a dose of $2.5 \times 10^{12}/cm^2$ by an energy of 25 KeV.

The boron ions are introduced into a deeper position than the arsenic ions because they are used for preventing the punch-through. As a result, the gate length dependency of the threshold voltage [Vth] can be improved to operate the n-channel MISFET Qn having a gate length of 0.2 μm normally.

On the other hand, the arsenic ions are used for reducing the threshold voltage [Vth] to about 0.3 V and are desirably introduced as shallow as possible.

Next, the photoresist film 34 is removed by the ashing. After this, a photoresist film 35 having p-channel MISFET forming region opened is formed to accomplish the channel doping for the p-channel MISFET (as shown in FIG. 10). At first, an ion implantation of phosphor ions is carried out in a dose of $7.0 \times 10^{12}/cm^2$ by an energy of 60 KeV. After this, another ion implantation of $BF_2$ ions is carried out in a dose of $2.5 \times 10^{12}/cm^2$ by an energy of 25 KeV.

The phosphor ions are used for preventing the punch-through and are introduced into a shallower position than the $B_2$ ions. As a result, the gate length dependency of the threshold voltage [Vth] can be improved to operate the p-channel MISFET Qp having a gate length of 0.2 μm normally.

On the other hand, the $BF_2$ ions are used for reducing the threshold voltage [Vth] to about $-0.3$ V and are desirably introduced as shallow as possible.

Next, the photoresist film 35 is removed by ashing. After this, the silicon oxide used for the channel doping is etched off in a diluted aqueous solution of fluoric acid, and the substrate surface is thermally oxidized in the nitrogen atmosphere at 800° C. and then in the steam atmosphere at 800° C. to form the gate insulating film 8 made of a silicon oxide film having a thickness of about 5 nm in the active regions of the n-type well 2 and the p-type well 3.

Figure 12:
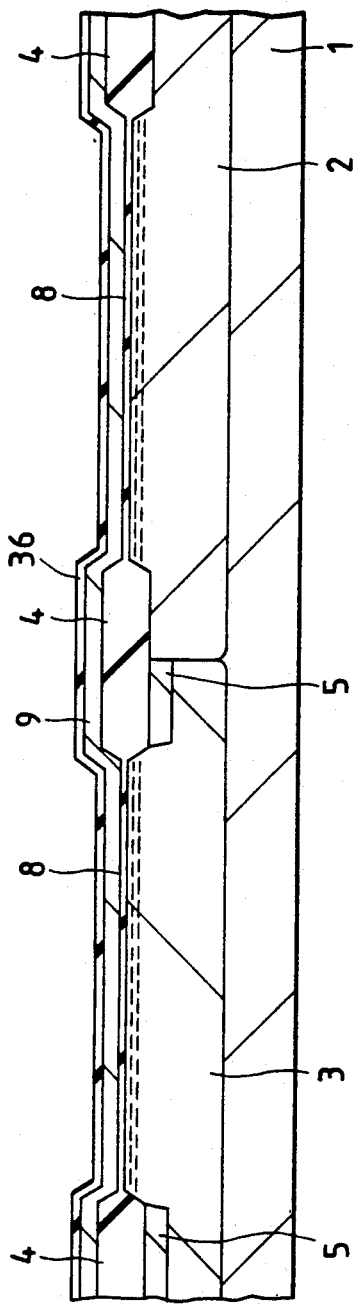

Next, the polycrystalline silicon film 9 having a thickness of about 150 nm is deposited all over the substrate by using a CVD method. After this, the substrate surface is thermally oxidized to form a silicon oxide film 36 having a thickness of about 5 nm in the surface of the polycrystal silicon film 9 (as shown in FIG. 12). The conditions for the thermal oxidation are substantially identical to those of the case of the gate insulating film 8.

Figure 13:
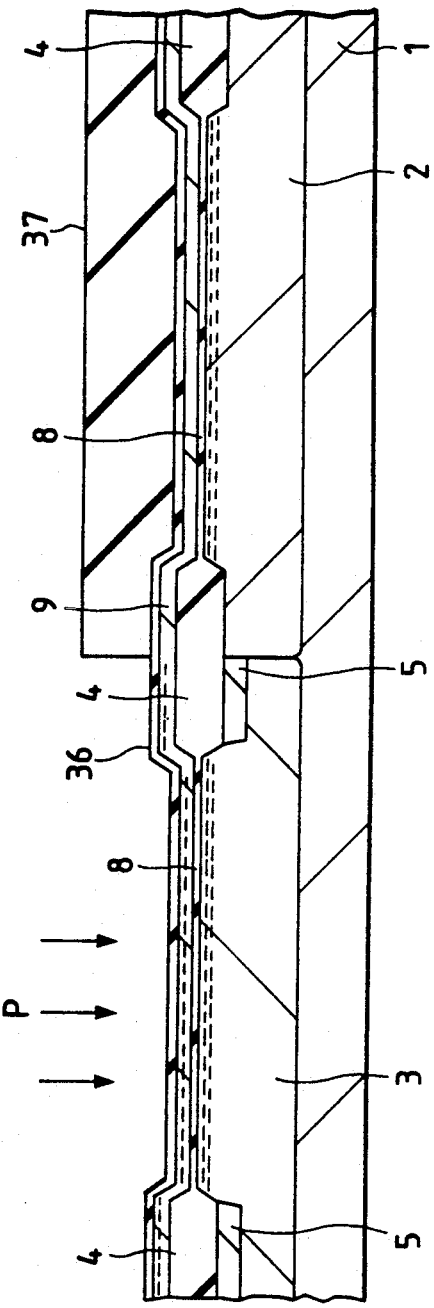

Next, a photoresist film 37 is formed to have its n-channel MISFET forming region opened. After this, this film 37 is used as a mask for ion implantation to dope the surface of the polycrystalline silicon film 9 with phosphor ions in a dose of $3.0 \times 10^{15}/cm^2$ by an energy of 20 KeV (as shown in FIG. 13). The amount of introduction of the phosphor ions is set so that the phosphor concentration in the polycrystalline silicon film 9 may be at about $1.0 \times 10^{20}/cm^3$ to prevent the gate electrode from being depleted.

Figure 14:
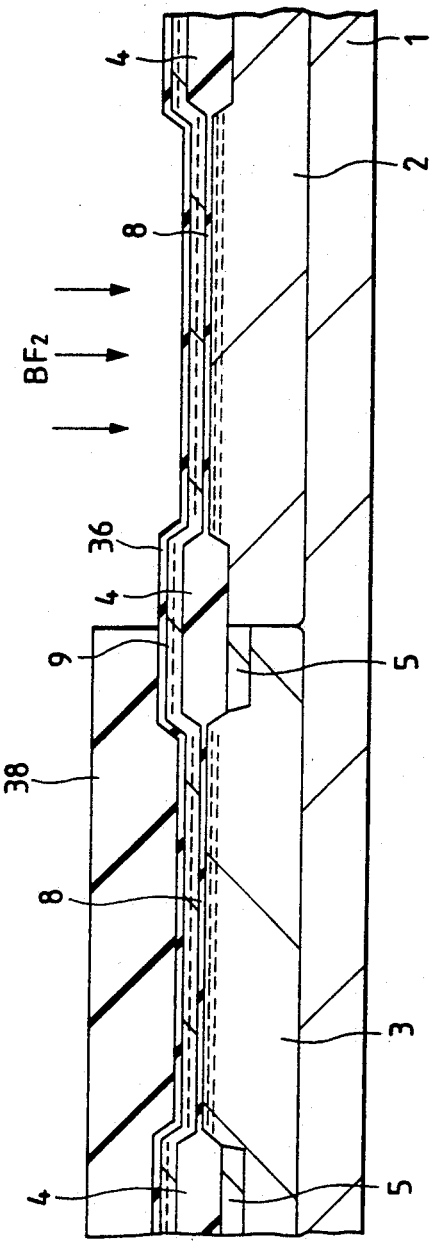

Next, the photoresist film 37 is removed by ashing. After this, a photoresist film 38 is formed to have its p-channel MISFET forming region opened and is used as a mask for ion implantations to dope the surface of the polycrystalline silicon film 9 with $BF_2$ ions in a dose of $3.0 \times 10^{15}/cm^2$ by an energy of 20 KeV (as shown in FIG. 14). The amount of introduction of the $BF_2$ ions is set so that the $BF_2$ concentration in the polycrystalline silicon film 9 may be at about $1.0 \times 10^{20}/cm^3$ to prevent the gate electrode from being depleted.

Figure 15:
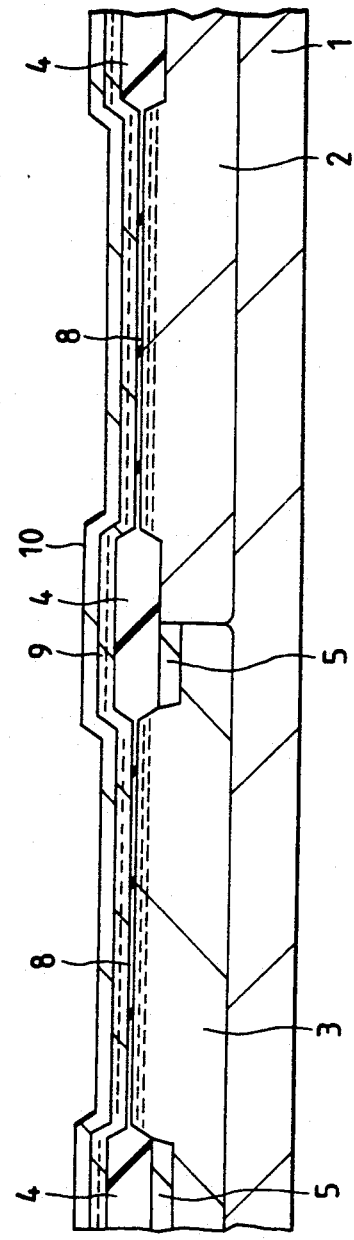
Figure 16:
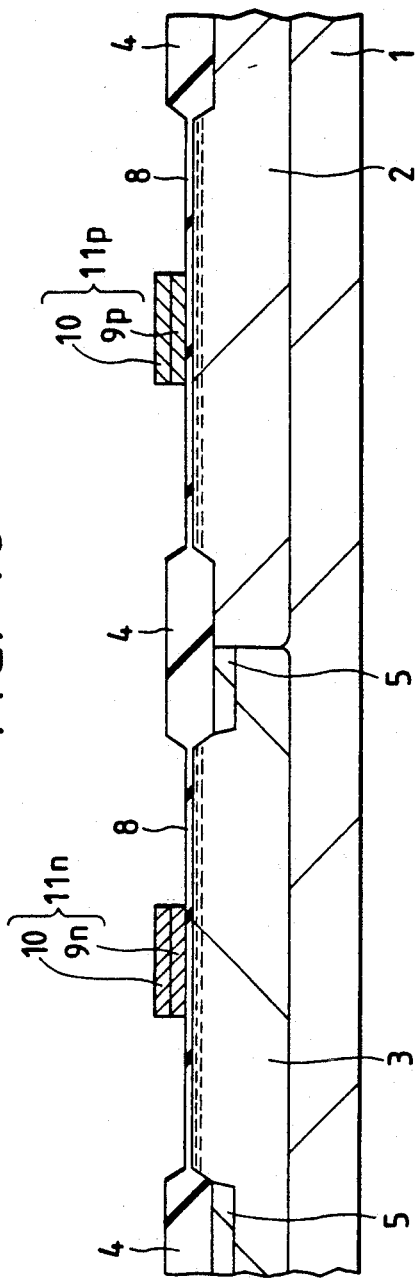

Next, the photoresist film 38 is removed by ashing. After this, the silicon oxide film 36 in the surface of the polycrystalline silicon film 9 is etched off in a diluted aqueous solution of fluoric acid, and the silicide film 10 of $WSi_x$ having a thickness of about 150 nm is deposited all over the substrate by using a CVD method (as shown in FIG. 15). The silicide film 10 is formed to drop the resistance of the gate electrode.

Next, the (not-shown) photoresist film is formed to have its gate electrode forming region opened thereover, and is used as a mask to etch and pattern the silicide film 10 and the polycrystalline silicon film 9 to form both the gate electrode 11n formed of a laminated film of the $n^+$-type polycrystalline silicon film 9n and the silicide film 10 and the gate electrode 11p formed of a laminated film of the $p^+$-type polycrystalline silicon film 9p and the silicide film 10.

Since the phosphor in the polycrystalline silicon film 9n and the boron in the polycrystalline silicon film 9p diffuse into each other through the silicide film 10 to prevent the threshold voltage [Vth] from becoming unstable, the gate electrodes 11n and 11p are not united but left in the isolated pattern.

Next, a heat treatment is carried out for activate and diffuse the phosphor in the polycrystalline silicon film 9n and the boron in the polycrystalline silicon film 9p. The conditions are at 950° C. and for about 6 minutes.

In this heat treatment, it is important to increase the concentration of the polycrystalline silicon films 9n and 9p up to the boundary of the gate insulating film 8. Especially, the boron in the polycrystalline silicon film 9p will diffuse the gate insulating film 8 easily to fluctuation of the characteristics of the p-channel MISFET Qp. Therefore, this heat treatment has to be carried out highly precisely and uses the well-known short-time annealing method of optical heating.

Next, ion implantations are carried out for forming the source and the drain. At first, the silicon oxide film 39 having a thickness of about 5 nm is deposited all over the substrate surface by using a CVD method to form a transmissive film for ion implantations. After this, the (not-shown) photoresist film is formed to have its n-channel MISFET forming region opened thereover. This photoresist film and the gate electrode 11n are used as the mask for the ion implantations introduce the arsenic ions in a dose of $1.0 \times 10^{14}/cm^2$ by an energy of 20 KeV. After this, the aforementioned photoresist film is removed by the ashing.

Figure 17:
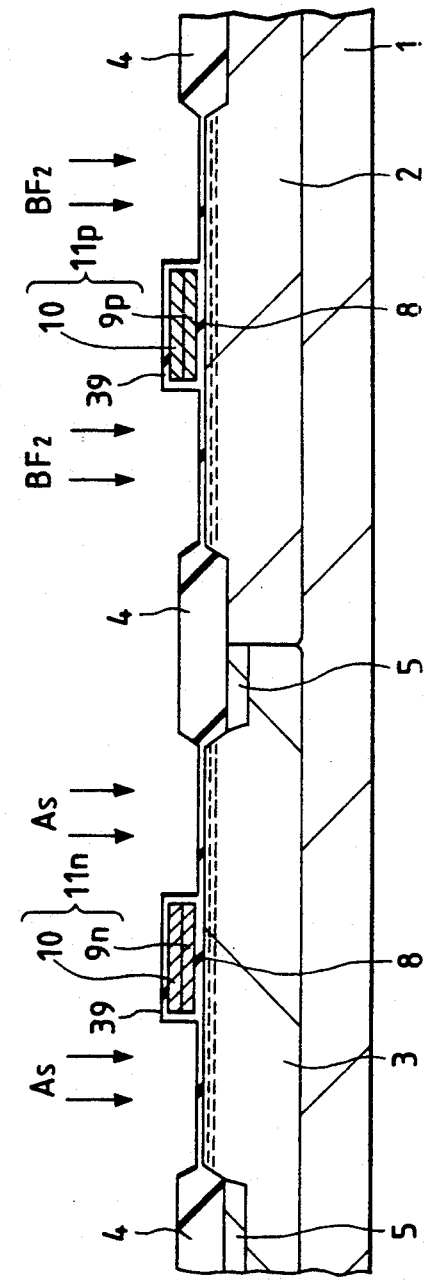

Subsequently, the (not-shown) photoresist film is formed to have its p-channel MISFET forming region opened thereover, and this photoresist film and the gate electrode 11p are used as a mask for the ion implantations to introduce the $BF_2$ ions in a dose of $1.0 \times 10^{14}/cm^2$ by an energy of 15 KeV. After this, the aforementioned photoresist film is removed by the ashing (as shown in FIG. 17).

Next, the (not-shown) silicon oxide film having a thickness of about 150 nm is deposited all over the substrate surface by using a CVD method. After this, this silicon oxide film is patterned by the anisotropic etching to form the side wall spacers 16 at the side walls of the gate electrodes 11n and 11p. These side wall spacers 16 have a width of about 100 nm.

Next, the silicon oxide film 17 having a thickness of about 5 nm is deposited all over the substrate surface by using a CVD method to form the transmissive film for ion implantations. After this, the (not-shown) photoresist film is formed to have its n-channel MISFET forming region opened thereover. This photoresist film, the gate electrode 11n and the side wall spacer 16 are used as a mask for the ion implantation to introduce the arsenic ions in a dose of $5.0 \times 10^{15}/cm^2$ by an energy of 20 KeV. After this, the aforementioned photoresist film is removed by ashing.

Subsequently, the (not-shown) photoresist film is formed to have its p-channel MISFET forming region opened thereover. This photoresist film, the gate electrode 11p and the side wall spacer 16 are used as a mask for ion implantations to introduce $BF_2$ ions in a dose of $2.0 \times 10^{14}/cm^2$ by an energy of 15 KeV. After this, the aforementioned photoresist film is removed by the ashing (as shown in FIG. 18).

In order to make the source and the drain shallow, the activations of the arsenic ions and $BF_2$ ions introduced are carried out later together with the reflow step of the BPSG film 19.

Next, the silicon oxide film 18 having a thickness of about 100 nm is deposited all over the substrate surface by using a CVD method. The silicon oxide film 18 is formed to prevent the impurity in the BPSG film 19 deposited thereover from diffusing into the n-type well 2 and the p-type well 3.

Subsequently, the BPSG film 19 having a thickness of about 600 nm is deposited all over the substrate surface by using a CVD method. After this, a heat treatment at 900° C. and for 2 minutes is carried out by using the optically heating short-time annealing method to fellow the BPSG film 19 and to activate the impurities in the source and drain.

After the steps thus far described, there are obtained: the n-channel MISFET Qn in which the diffusion layer resistance of the source and drain is 100 [Ω/cm] and in which a junction depth of about 0.1 μm; and the p-channel MISFET Qp in which the diffusion layer resistance of the source and drain is 250 [Ω/cm] and in which the Junction depth is about 0.1 μm.

After this, the not-shown photoresist film is used as an etching mask to form the connection hole 23 in the BPSG film 19. After this, the barrier metal 20 made of TiW or TiN and having a thickness of about 250 nm and the Al alloy film 21 having a thickness of about 550 nm are sequentially deposited all over the substrate surface by using the sputtering method and are patterned to form the metal wiring line 22.

At last, in order to stabilize the n-channel MISFET Qn and the p-channel MISFET Qp, a heat treatment is carried out in the hydrogen atmosphere at 400° C. to complete the CMOSFET shown in FIG. 1.

Next, the operations and effects of the CMOSFET thus constructed will be described with reference to FIGS. 20 to 25.

Figure 20:
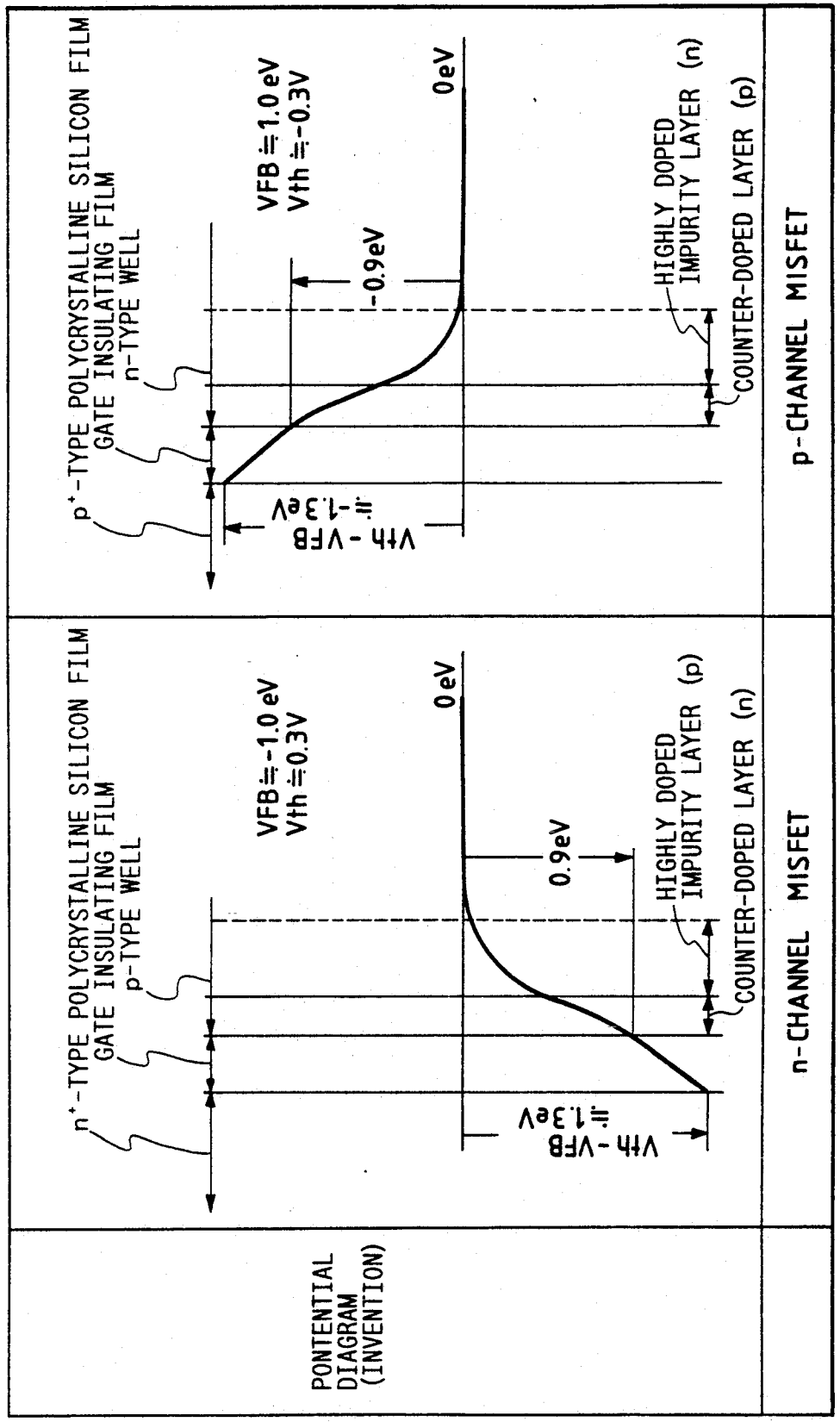
FIG. 20 is a diagram showing a potential of the channel region of the CMOSFET of the present invention.
Figure 21:
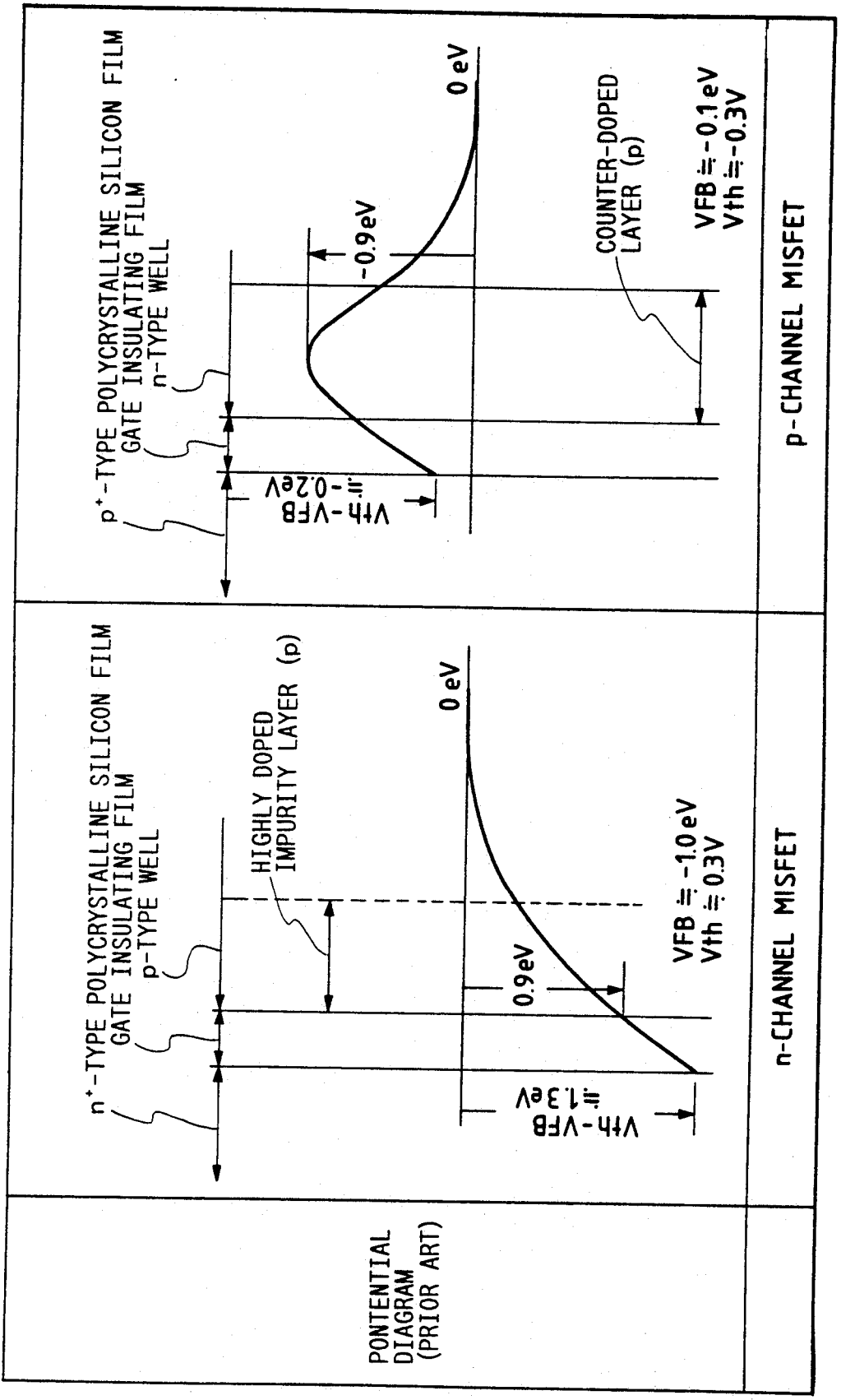
FIG. 21 is a diagram showing a potential of the channel region of the CMOSFET of the prior art.

FIG. 20 is a potential diagram of the channel region of the CMOSFET of the present invention, and FIG. 21 is a potential diagram of the channel region of the CMOSFET of the prior art, in which both the gate electrodes of the n-channel MISFET and the p-channel MISFET are made of $n^+$-type polycrystalline silicon. In either potential diagram, the gate voltage age [Vg] is equal to the threshold voltage [Vth].

First of all, the prior art of FIG. 21 will be described in the following. In the prior art, the channel region of the n-channel MISFET has an impurity layer doped with an impurity (e.g., a p-type impurity) having a conductivity type identical to that of the well, whereas the channel region of the p-channel MISFET has a counter-doped layer doped with an impurity (e.g., a p-type impurity) having a conductivity type opposite to that of the well.

This counter-doped layer is formed to adjust the threshold voltage [Vth] of the p-channel MISFET to the threshold voltage [Vth] of the n-channel MISFET. It is a feature of the structure that the portion having the minimum potential of the p-channel MISFET is located on the substrate surface but at the bulk side. Thus, the conduction channel between the source and drain is formed from the inside of the bulk (i.e., the buried channel type structure).

In this p-channel MISFET, the channel for the carriers to flow therethrough is located in the substrate so that the hot carriers hardly exert any influence on the boundary between the substrate and the gate insulating film to cause little drop in the reliability due to the hot carriers. On the other hand, the n-channel MISFET has the surface channel type structure to cause high drop in the reliability due to the hot carriers.

Next, the present invention of FIG. 20 will be described in the following. In both the n-channel MISFET and the p-channel MISFET, according to the present invention, the channel region is formed at its substrate side with the highly doped impurity layer, which is doped with an impurity having the conductivity type identical to that of the well thereof, and at its surface with with a counter-doped layer which is doped with an impurity having the conductivity type opposite to that of the well thereof.

This counter-doped layer has a lower impurity concentration and a smaller width than those of the counter-doped layer of the prior art so that the portion having the minimum potential is located not in the substrate but in the boundary between the substrate and the gate insulating film. As a result, both the n-channel MISFET and the p-channel MISFET are constructed to have a high reliability drop due to the hot carriers. However, this problem can be solved by dropping the supply voltage [Vcc] to 2 V.

Figure 22:
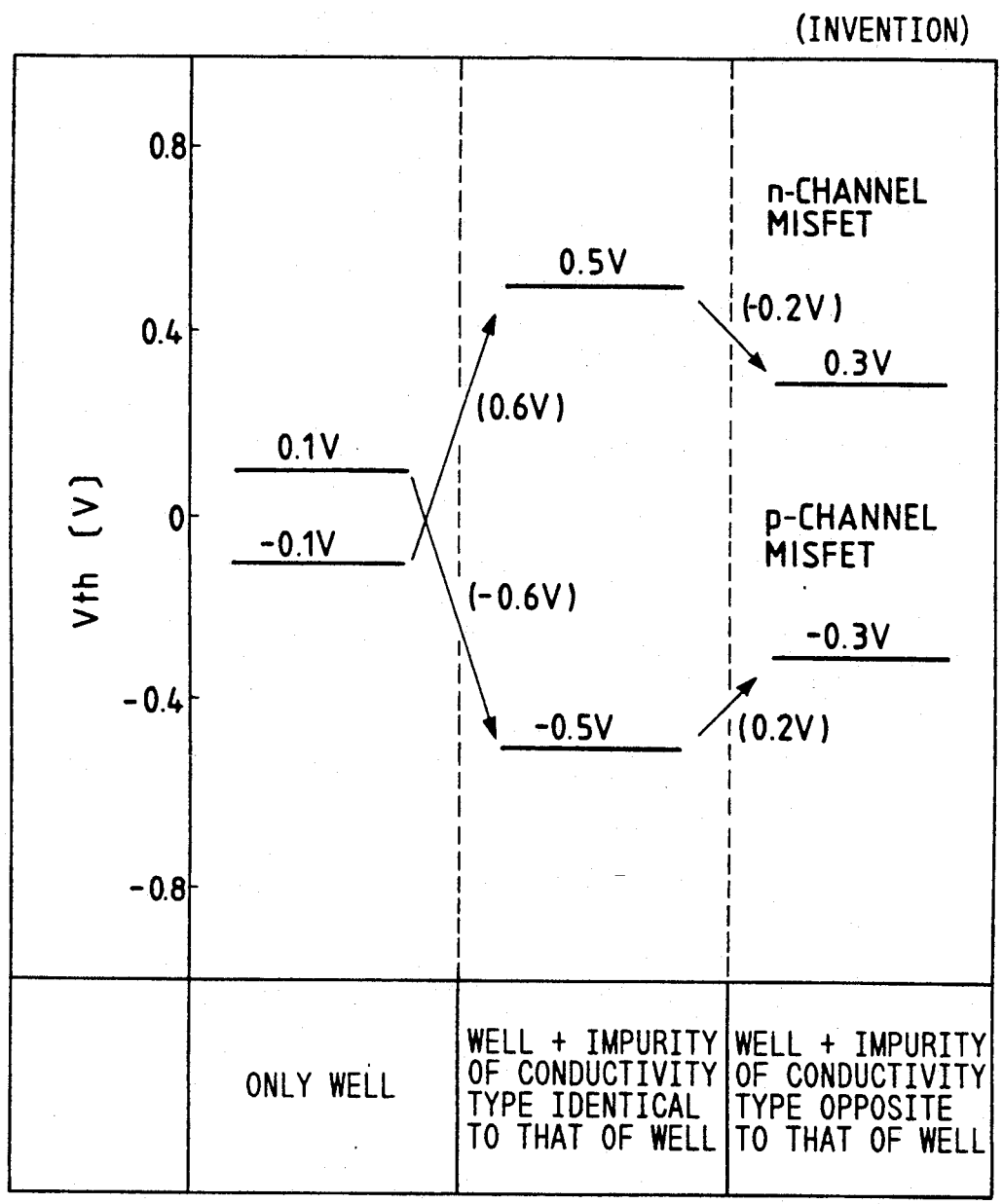
FIG. 22 is a diagram for explaining a method of reducing a threshold voltage according to the present invention.
Figure 23:
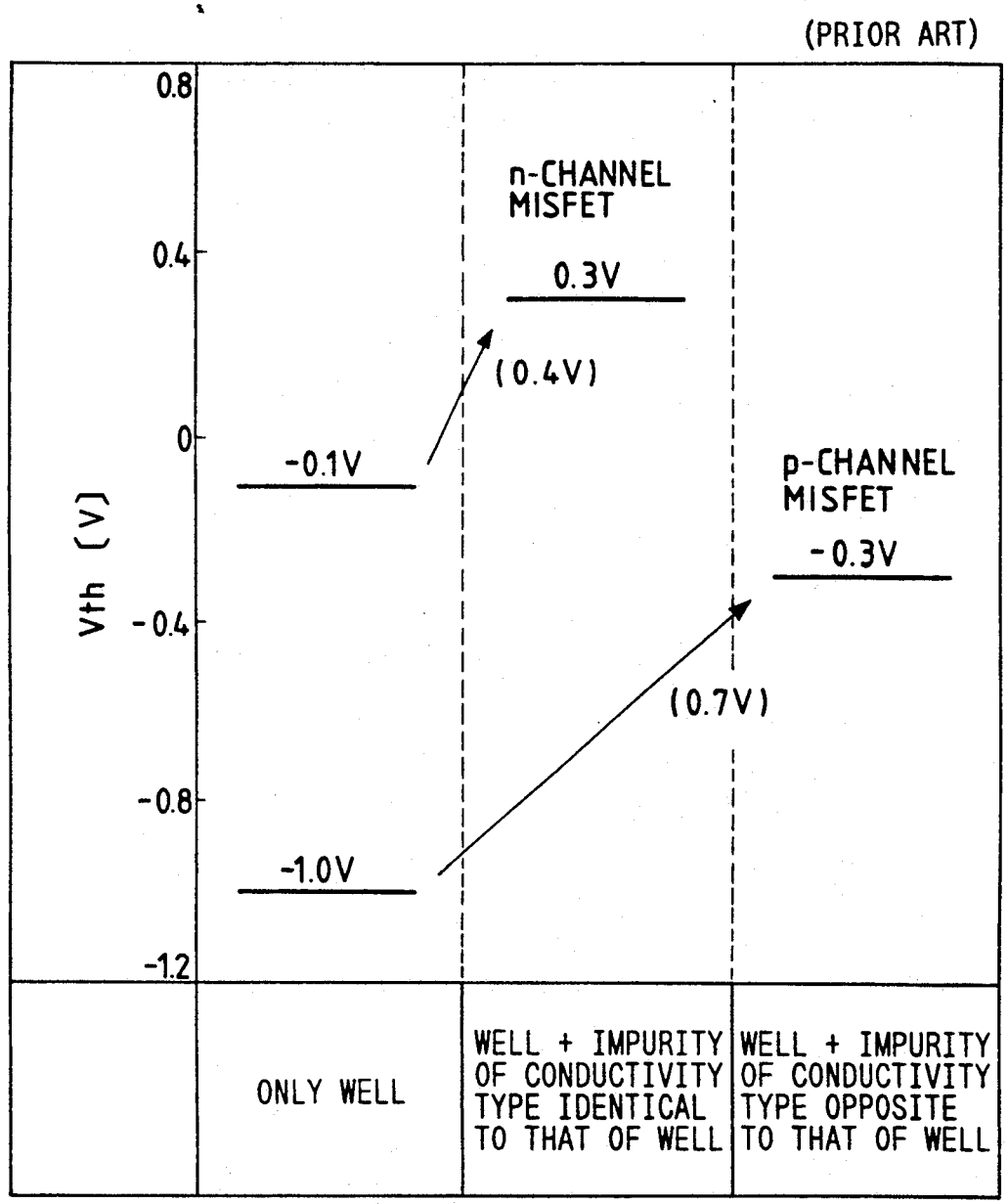
FIG. 23 is a diagram for explaining a method of reducing a threshold voltage according to the prior art.

FIGS. 22 and 23 are diagrams for explaining the conceptional differences between the present invention and the prior art as to the method of setting the threshold voltage [Vth] to about 0.3 V. FIG. 22 shows the method of the present invention, and FIG. 23 shows the method of the prior art.

The abscissas of the individual Figures correspond to the cases: (1) an impurity in the channel region is only that of the well; (2) an impurity having the conductivity type identical to that of the well is doped; and (3) the surface is doped with an impurity having the conductivity type opposite to that of the well to set the threshold voltage [Vth] to about 0.3 V (whereas the p-channel MISFET is set to have a threshold voltage [Vth] of about −0.3 V).

Incidentally, the n-channel MISFET of the prior art has its channel region left undoped with the impurity having the conductivity type opposite to that of the well but doped with the impurity having the conductivity type identical to that of the well to set the threshold voltage [Vth] to about 0.3 V. Moreover, the p-channel MISFET of the prior art has its channel region left undoped with the impurity having the conductivity type identical to that of the well but doped with the impurity having the conductivity type opposite to that of the well to set the threshold voltage [Vth] to about −0.3 V.

Incidentally, the parenthesized numerical values in the Figures indicate the amounts of shift of the threshold voltage [Vth] resulting from the doping of the individual impurities.

First of all, the case of the n-channel MISFET will be described by comparing FIGS. 22 and 23. In case the impurity of the channel region is restricted to the well, both the present invention and the prior art have a threshold voltage [Vth] of about −0.1 V.

In the present invention, the impurity having the conductivity type identical to that of the well is introduced to set the threshold voltage [Vth] to about 0.5 V. In the prior art, the impurity having the conductivity type identical to that of the well is introduced to set the threshold voltage [Vth] to about 0.3 V.

Specifically, the method of the present invention shifts the threshold voltage [Vth] more in the positive direction than that of the prior art so that it can prevent the punch-through effectively.

Since the gate length dependency of the threshold voltage [Vth] is reduced, it is easy to realize the short channel. After this, the surface is doped with the impurity having the conductivity type opposite to that of the well to set the threshold voltage [Vth] to about 0.3 V.

Next, the case of the p-channel MISFET will be described in the following. In case the impurity of the channel region is restricted to the well, the present invention has a threshold voltage [Vth] of about 0.1 V, whereas the prior art has a threshold voltage [Vth] of about −1.0 V. This difference is caused from the difference in the work function between the gate electrode and the substrate (or well).

In the present invention, the impurity having the conductivity type identical to that of the well is introduced to set the threshold voltage [Vth] to about −0.5 V. In the prior art, the impurity having the conductivity type opposite to that of the well is introduced to set the threshold voltage [Vth] to about −0.3 V.

Figure 26:
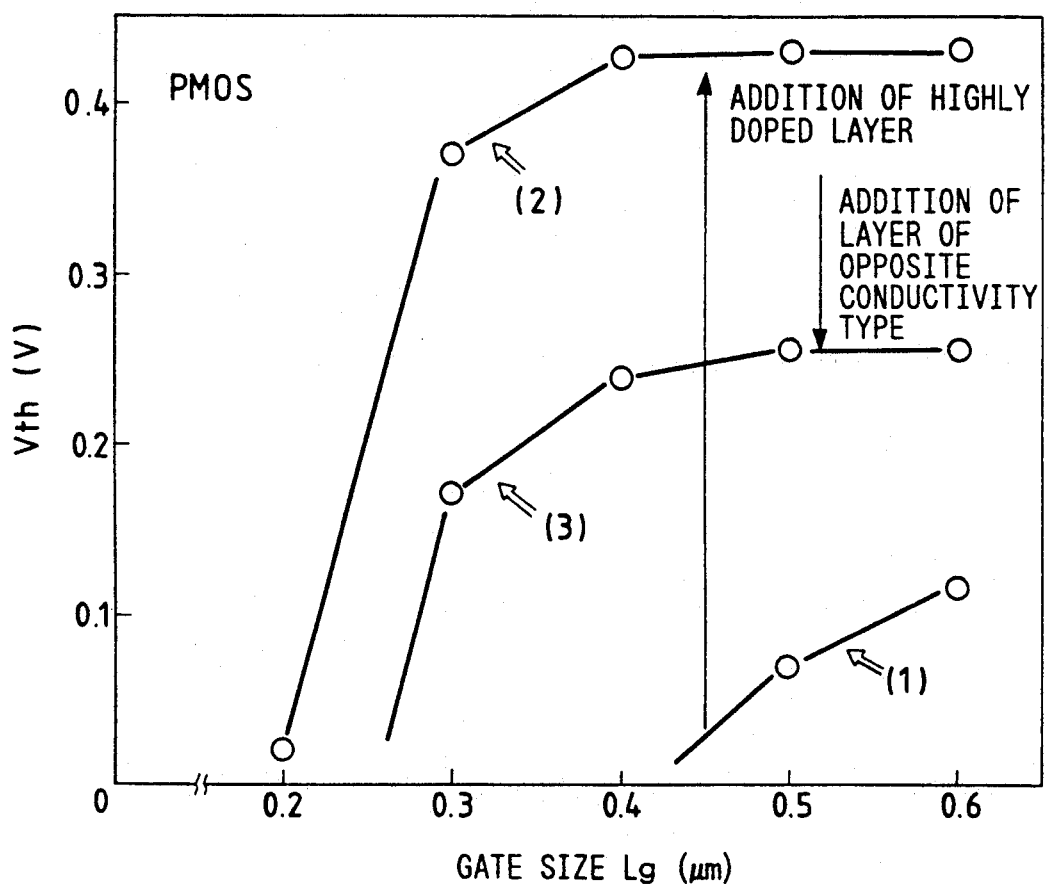
FIG. 26 is a diagram showing relations between the gate size of a PMOSFET and the threshold voltage.

FIG. 26 shows a relation between the gate size of a p-channel MISFET of the present invention and the threshold voltage [Vth].

In FIG. 26: a curve (1) plots the case, in which the impurity in the channel region is restricted to that of the well; a curve (2) plots the case, in which the impurity having the conductivity type identical to that of the well is introduced; and a curve (3) plots the case, in which not only the impurity having the conductivity type identical to that of the well but also the impurity having the conductivity type opposite to that of the well are introduced.

According to the method of the present invention, as could be apparent from FIG. 26, the threshold voltage [Vth] is shifted more in the negative direction than that of the method of the prior art so that the punch-through can be effectively prevented.

As a result, the gate length dependency of the threshold voltage [Vth] can be reduced to realize the short channel easily.

According to the present invention, the surface is then doped with an impurity having the conductivity type opposite to that of the well to set the threshold voltage [Vth] to about −0.3 V. Specifically, the threshold voltage [Vth] is shifted in the positive direction by about 0.7 V in accordance with the method of the prior art, whereas the shift of about 0.2 V is sufficient in the method of the present invention. In the method of the present invention, therefore, the dose of the doping impurity having the opposite conductivity type can be less than that of the method of the prior art so that the counter-doped layer can be made shallow. As a result, as could be apparent from FIG. 25, the gate length dependency of the threshold voltage [Vth] is not seriously deteriorated.

Figure 24:
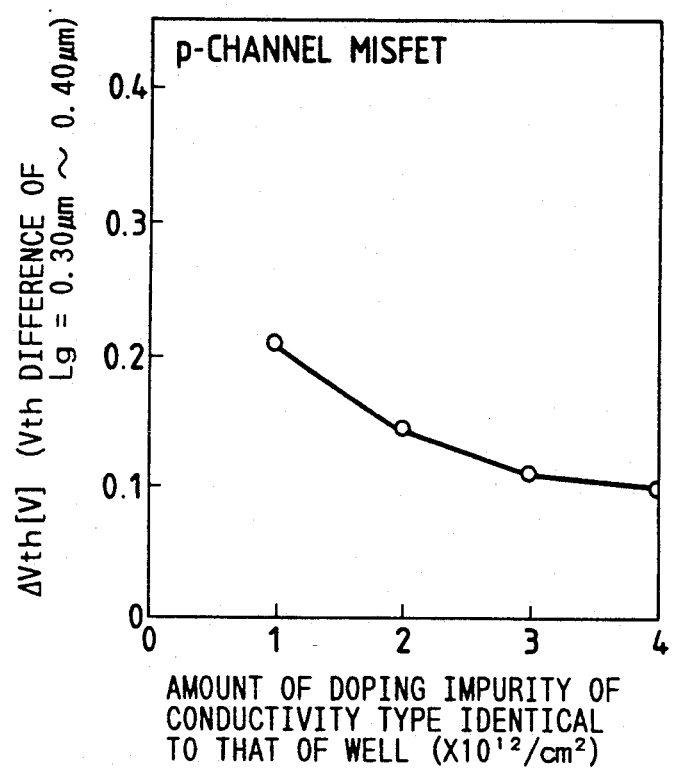
FIG. 24 is a diagram showing a relation between the amount of a doping impurity of conductivity type identical to that of a substrate and the gate length dependency of the threshold voltage.

FIG. 24 plots the result of the influences, which were examined by simulations on the gate length dependency (Δ Vth) of the threshold voltage [Vth] in case the channel region of the p-channel MISFET of the present invention is doped with an impurity having the conductivity type identical to that of the well to form a heavily doped impurity layer. Incidentally, the dose of the impurity is adjusted to set the threshold voltage [Vth] constant within a range of 0.25 to 0.35 μm of the gate length (Lg).

The result of the simulations has revealed that the gate length dependency Δ Vth is improved the better for the higher dose of the impurity having the conductivity type identical to that of the well.

Figure 25:
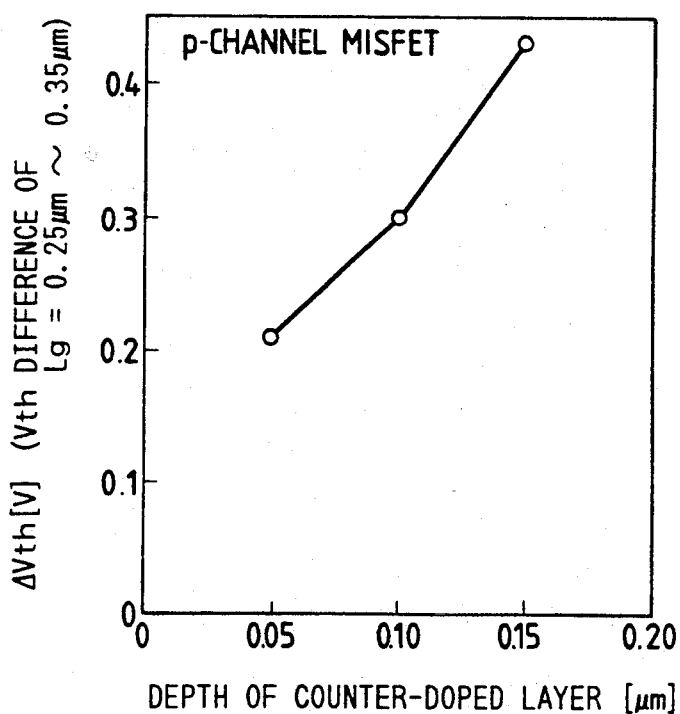
FIG. 25 is a diagram showing a relation between the depth of a counter-doped layer and the gate length dependency of the threshold voltage.

FIG. 25 plots the result of the influences, which were examined by simulations on the gate length dependency of the threshold voltage [Vth] in case the channel region of the p-channel MISFET of the present invention is formed at its surface side with the counter-doped layer.

In FIG. 25, the ordinate plots the gate length dependency (Δ Vth) of the threshold voltage [Vth], and the abscissa plots the depth of the counter-doped layer. Incidentally, the dose of the impurity is adjusted to set the threshold voltage [Vth] constant within a range of 0.25 to 0.35 μm of the gate length (Lg).

The result of the simulations has revealed that the gate length dependency Δ Vth can be reduced for the shallower counter-doped layer. This is because, if the counter-doped layer is the shallower, the influences of the impurity of the opposite conductivity type substantially act, as if they shifted the work function difference between the gate electrode and the substrate.

In other words, the dose of the impurity having the opposite conductivity type is desirably low. On the other hand, the kind of the impurity is desired to have a small diffusion coefficient. The p-channel MISFET is advantageous for the short channel because the threshold voltage [Vth] can be dropped by the p-type gate electrode even if the counter-doped layer has a low impurity concentration.

Since, moreover, the n-channel MISFET of the present invention forms the counter-doped layer of arsenic having a low diffusion coefficient, it can reduce the gate length dependency Δ Vth of the threshold voltage [Vth] more than the prior art so that it is advantageous for the short channel.

Although our invention has been specifically described hereinbefore in connection with the embodiment thereof, it should not be restricted to the aforementioned embodiment but can naturally be modified in various manners without departing from the gist thereof.

The effects obtainable from the representative embodiment of the invention disclosed herein will be briefly described in the following.

According to the present invention, both the n-channel MISFET and the p-channel MISFET can have reduced threshold voltages [Vth] without deteriorating the gate length dependency of the threshold voltage [Vth]. Thus, it is possible to realize a short-channel CMOS device which can exhibit a high performance if driven at a low voltage.

What is claimed is:

1. A semiconductor integrated circuit device including a CMOSFET having an enhancement type n-channel MISFET and an enhancement type p-channel MISFET formed over a semiconductor substrate, comprising:

a p-type first semiconductor region and an n-type second semiconductor region formed in the surface of said semiconductor substrate;

a first gate electrode formed over said first semiconductor region through a first gate insulating film and comprised of an n-type polycrystalline silicon layer, and a second gate electrode formed over said second semiconductor region through a second gate insulating film and comprised of a p-type polycrystalline silicon layer;

n-type third and fourth semiconductor regions positioned at the two ends of said first gate electrode and formed in said first semiconductor region, and p-type fifth and sixth semiconductor regions positioned at the two ends of said second gate electrode and formed in said second semiconductor region;

a p-type seventh semiconductor region formed in said first semiconductor region and between said third and fourth semiconductor regions, and an n-type eighth semiconductor region formed in said second semiconductor region and between said fifth and sixth semiconductor regions, wherein said seventh and eighth semiconductor regions are more heavily doped than said first and second semiconductor regions; and an n-type ninth semiconductor region formed in said first semiconductor region and between said third and fourth semiconductor regions, and a p-type tenth semiconductor region formed in said second semiconductor region and between said fifth and sixth semiconductor regions, wherein said ninth semiconductor region is formed in the surface of said semiconductor substrate and in a shallower position than said seventh semiconductor region to comprise a pn junction together with said seventh semiconductor region, wherein the tenth semiconductor region is formed in the surface of said semiconductor substrate and in a shallower position than said eighth semiconductor region to comprise a pn junction together with said eighth semiconductor region, and wherein each of said n-channel MISFET and said p-channel MISFET has a gate length of 0.2 μm or less.

2. A semiconductor integrated circuit device according to claim 1, wherein said semiconductor integrated circuit device has a supply voltage of 2 V or less.

3. A semiconductor integrated circuit device according to claim 2, wherein said n-channel MISFET has a threshold voltage of about 0.3 V whereas said p-channel MISFET has a threshold voltage of about −0.3 V.

4. A semiconductor integrated circuit device according to claim 1, wherein each of said first and second gate electrodes comprises a polycrystalline silicon layer and a silicide film formed thereon.

5. A semiconductor integrated circuit device according to claim 1, further comprising an n-type eleventh semiconductor region formed between said fourth semiconductor region and said ninth semiconductor region, wherein said eleventh semiconductor region has a smaller impurity concentration than said fourth semiconductor region.

6. A semiconductor integrated circuit device according to claim 5, further comprising a p-type twelfth semiconductor region formed between said sixth semiconductor region and said tenth semiconductor region, wherein said twelfth semiconductor region has smaller impurity concentration than said sixth semiconductor region.

7. A semiconductor integrated circuit device according to claim 6, further having sidewall spacers formed on the side surface of said first and second gate electrode, wherein each of said third and fourth semiconductor regions is formed in a self-aligned manner with said sidewall spacer formed on the side surface of said first gate electrode, and wherein each of said fifth and sixth semiconductor regions is formed in a self-aligned manner with said sidewall spacer formed on the side surface of said second gate electrode.

8. A semiconductor integrated circuit device according to claim 7, wherein said eleventh semiconductor region is formed in a self-aligned manner with said first gate electrode, and said twelfth semiconductor region is formed in a self-aligned manner with said second gate electrode.

* * * * *